United States Patent
Schmitz et al.

(10) Patent No.: US 11,742,840 B2
(45) Date of Patent: *Aug. 29, 2023

(54) NOISE DISTURBANCE REJECTION FOR POWER SUPPLY

(71) Applicant: Alpha and Omega Semiconductor International LP, Toronto (CA)

(72) Inventors: Richard Schmitz, San Tan Valley, AZ (US); Tsing Hsu, Dallas, TX (US)

(73) Assignee: Alpha and Omega Semiconductor International LP, Toronto (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/662,290

(22) Filed: May 6, 2022

(65) Prior Publication Data

US 2022/0352881 A1 Nov. 3, 2022

Related U.S. Application Data

(63) Continuation of application No. 17/302,369, filed on Apr. 30, 2021, now Pat. No. 11,368,144.

(51) Int. Cl.
*H03K 5/125* (2006.01)
*H03K 5/1252* (2006.01)
*H04B 15/00* (2006.01)

(52) U.S. Cl.
CPC ........... *H03K 5/1252* (2013.01); *H04B 15/00* (2013.01)

(58) Field of Classification Search
CPC ........ H03K 5/01; H03K 5/125; H03K 5/1252; H03K 17/16; H03K 19/00346; H02M 1/14; H02M 1/143; H02M 1/15; H02M 1/4258; H02M 3/33523; H02M 3/33553; H04B 15/00; H04B 15/005; H04B 1/0475; H04B 1/1018

See application file for complete search history.

(56) References Cited

U.S. PATENT DOCUMENTS 9,673,849 B1 * 6/2017 Paraschou ................ H04B 1/76
10,187,094 B1 * 1/2019 Nedovic .................. H04B 1/16
11,368,144 B1 * 6/2022 Schmitz ................. H04B 15/00

* cited by examiner

*Primary Examiner* — Long Nguyen
(74) *Attorney, Agent, or Firm* — Craige Thompson; Thompson Patent Law; Timothy D. Snowden

(57) ABSTRACT

Apparatus and associated methods relate to a power supply noise disturbance rejection circuit (NDRC) having a first circuit reference potential (CRP1), a second circuit reference potential (CRP2), and a galvanic link conductively connecting CRP1 and CRP2 and providing a non-zero resistance return path for at least one current mode signal (CMS). In an illustrative example, a power supply monitor circuit (PSMC) may be referenced to CRP1 and a control circuit to CRP2. The PMSC may, for example, generate a voltage mode signal (VMS) relative to CRP1 and representing an output parameter of a power supply circuit (PSC), and convert the VMS into a first CMS (CMS1). The control circuit may, for example, generate a control signal for the PSC from CMS1. Various embodiments may advantageously attenuate a noise margin of a CMS presented at the control circuit by a factor of at least 10 relative to an equivalent VMS.

20 Claims, 5 Drawing Sheets

NOISE DISTURBANCE REJECTION FOR POWER SUPPLY

CROSS-REFERENCE TO RELATED APPLICATIONS

This application is a Continuation and claims the benefit of U.S. application Ser. No. 17/302,369, titled "Noise Disturbance Rejection for Power Supply," filed by Richard Schmitz, et al., on Apr. 30, 2021, now U.S. Pat. No. 11,368,144, issued Jun. 21, 2022.

This application incorporates the entire contents of the foregoing application(s) herein by reference.

TECHNICAL FIELD

Various embodiments relate generally to noise disturbance rejection in power supply circuits.

BACKGROUND

Electronic devices receive power in a variety of ways. For example, consumer electronic devices may receive power from a wall outlet (e.g., mains) or from various portable sources (e.g., batteries, renewable energy sources, generators). Battery operated devices have an operational time that is dependent upon battery capacity and average current draw. Manufacturers of battery powered devices may strive to reduce average battery current of their products to offer longer device use between battery replacement or between charge operations. In some examples, manufacturers of mains-powered devices may strive to increase power efficiency of their products to minimize thermal loads and/or to maximize the performance per watt of power consumed.

In some electronic devices, an input voltage supply (e.g., battery input, rectified mains supply, intermediate DC supply) may be converted to a different voltage by various voltage conversion circuits. Switch-mode power supplies have gained popularity as voltage conversion circuits due to their high efficiency and therefore are often used in various electronic devices.

Switch-mode power supplies convert voltages using switching devices that turn on with very low resistance and turn off with very high resistance. Switch-mode power supplies may charge an output inductor during a period of time and may release part or all of the inductor energy during a subsequent period of time. The output energy may be delivered to a bank of output capacitors, which provide the filtering to produce a DC output voltage. In buck-derived switch-mode power supplies, the output voltage, in a steady state, may be approximately the input voltage times a duty cycle, where the duty cycle is the duration of the on-time of a pass switch divided by the total on-time and off-time of the pass switch for one switching cycle.

SUMMARY

Apparatus and associated methods relate to a power supply noise disturbance rejection circuit (NDRC) having a first circuit reference potential (CRP1), a second circuit reference potential (CRP2), and a galvanic link conductively connecting CRP1 and CRP2 and providing a non-zero resistance return path for at least one current mode signal (CMS). In an illustrative example, a power supply monitor circuit (PSMC) may be referenced to CRP1 and a control circuit to CRP2. The PMSC may, for example, generate a voltage mode signal (VMS) relative to CRP1 and representing an output parameter of a power supply circuit (PSC), and convert the VMS into a first CMS (CMS1). The control circuit may, for example, generate a control signal for the PSC from CMS1. Various embodiments may advantageously attenuate a noise margin of a CMS presented at the control circuit by a factor of at least 10 relative to an equivalent VMS.

Various embodiments may achieve one or more advantages. For example, some embodiments may advantageously reduce a noise disturbance of an output parameter(s) to at least ten percent (10%) of an output parameter(s) transmitted via a voltage mode signal. Accordingly, a control signal(s) may more accurately respond to a current output parameter(s) of a power supply.

Various embodiments may advantageously meet or exceed power supply signal parameter requirements of loads such as, by way of example and not limitation, high-performance processors. In various embodiments, for example, a power supply circuit may advantageously meet a more restrictive (e.g., smaller) error tolerance in providing a power supply signal to a load than a power supply circuit transmitting output parameter signal(s) across one or more circuit reference domains in voltage mode. Various embodiments may advantageously provide, for example, improved noise rejection at arbitrarily higher frequencies than achievable with voltage mode output parameter signals.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, to help introduce discussion of various embodiments, a noise disturbance rejection circuit (NDRC) configured to transmit an output parameter in current mode across at least two circuit reference domains (CRDs) is introduced with reference to FIG. 1. Second, that introduction leads into a description with reference to FIGS. 2-5 of some exemplary embodiments of NDRCs and associated circuits. Finally, the document discusses further embodiments, exemplary applications and aspects relating to NDRCs.

Figure 1:
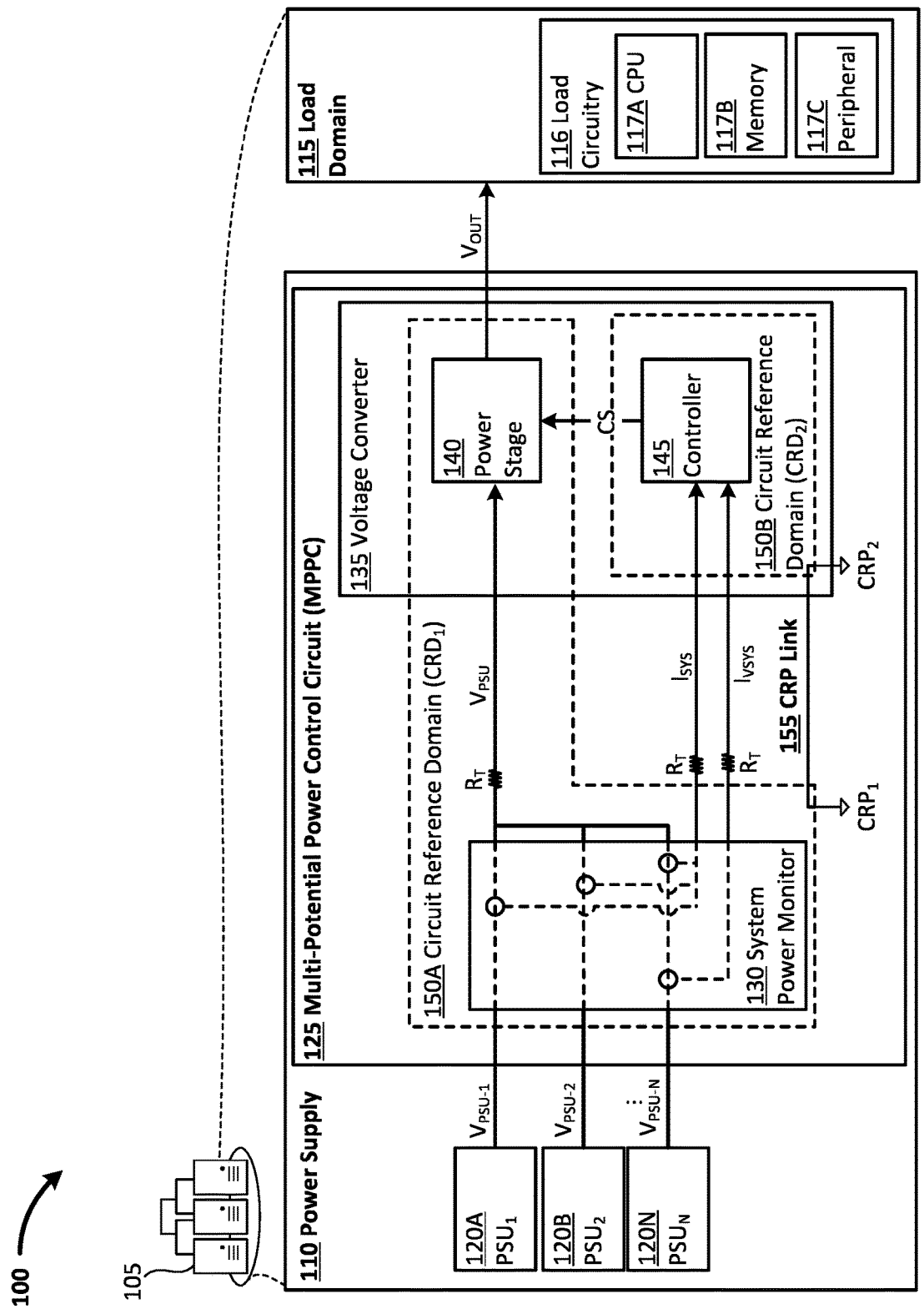
FIG. 1 depicts an exemplary noise disturbance rejection circuit (NDRC) in an illustrative use-case scenario of a power supply circuit providing power to a load, in which the NDRC is configured to transmit an output parameter(s) as a current mode signal(s) between two circuit reference domains (CRDs).

FIG. 1 depicts an exemplary noise disturbance rejection circuit (NDRC) configured to transmit an output parameter(s) as a current mode signal(s) between two circuit reference domains (CRDs). In the depicted example, the NDRC is employed in an illustrative use-case scenario of a power supply circuit providing power to a load. In the depicted illustrative use-case scenario 100, servers 105 are provided with power by a power supply circuit 110. The power supply circuit 110 provides power (e.g., via voltage out $V_{OUT}$) to a load domain 115 of the servers 105. The power supply circuit 110 may include, by way of example and not limitation, one or more switching power supplies. As depicted, the load domain 115 of the server 105 includes load circuitry 116. The depicted load circuitry 116 includes, by way of example and not limitation, a processor 117A (labelled as CPU), memory 117B, other associated peripherals 117C, or some combination thereof.

As depicted, the power supply 110 includes individual power supply units PSU1 120A, PSU2 120 B, PSUN 120N. Each power supply unit outputs a corresponding power supply voltage (e.g., 12V DC) VPSU-1, VPSU-2, VPSU-N. The power supply voltage is input to a multi-potential power control circuit (MPPC) 125. The MPPC 125 includes a system power monitor circuit (SPMC) 130 and a voltage converter circuit 135. The SPMC 130 monitors at least one voltage signal (VPSU-N) of a power output of at least one power supply unit. The voltage converter circuit 135 may be configured to operate on the voltage signal VPSU and supply the load domain 115 with a regulated VOUT. In the depicted example, a power stage 140 of the voltage converter 135 converts the voltage signal VPSU into VOUT. The power stage 140 may, for example, include an interleaved switching power stage, a step-down transformer, a step-up transformer, or some combination thereof.

In the depicted example, the power stage 140 responds to a control signal (CS) from a controller 145. The controller 145 receives a current output parameter signal (ISYS) and a voltage output parameter signal (VSYS) from the system power monitor 130. The controller 145 may determine the control signal CS as a function of at least one of the output parameter signals. A path between the system power monitor 130 and the controller 145 has a non-zero impedance, which may include as its real component a transmission resistance RT. The transmission resistance may, by way of example and not limitation, include a trace resistance, a conductor resistance, a wire resistance, a backplane resistance, ground plane resistance, or some combination thereof. In various embodiments the resistance may include a combination of real and/or imaginary components including, for example, resistance, inductance, and/or capacitance.

In the depicted example, the SPMC 130 and the power stage 140 are in a first circuit reference domain (CRD1) operably referenced to a first circuit reference potential (CRP1). The controller 145 is in a second circuit reference domain (CRD2) operably referenced to a second circuit reference potential (CRP2). CRP1 and CRP2 are electrically connected by a galvanic circuit reference potential (CRP) link 155. At least one of the output parameter signals ISYS and IVSYS is sensed in a voltage mode and converted to a current mode before being transmitted to the controller 145. The CRP link 155 may, for example, provide a non-zero resistance return path for the output parameter signal(s).

Accordingly, by transmitting the output parameter signal(s) in current mode and providing the CRP link 155 between the CRP1 and the CRP2, a noise disturbance (e.g., DC offset, loss, impedance discontinuity, crosstalk) of the output parameter(s) may be advantageously reduced to at least ten percent (10%) of an output parameter(s) transmitted via a voltage mode signal. Accordingly, the control signal CS may more accurately respond to a current output parameter(s) of the VPSU (e.g., where VPSU-N=VPSU). Accordingly, more stable power output VOUT may be provided to the load domain 115. For example, a processor 117A may be provided with an increased stability power supply by improving noise rejection in the output parameter signal(s) to the controller 145.

Figure 2:
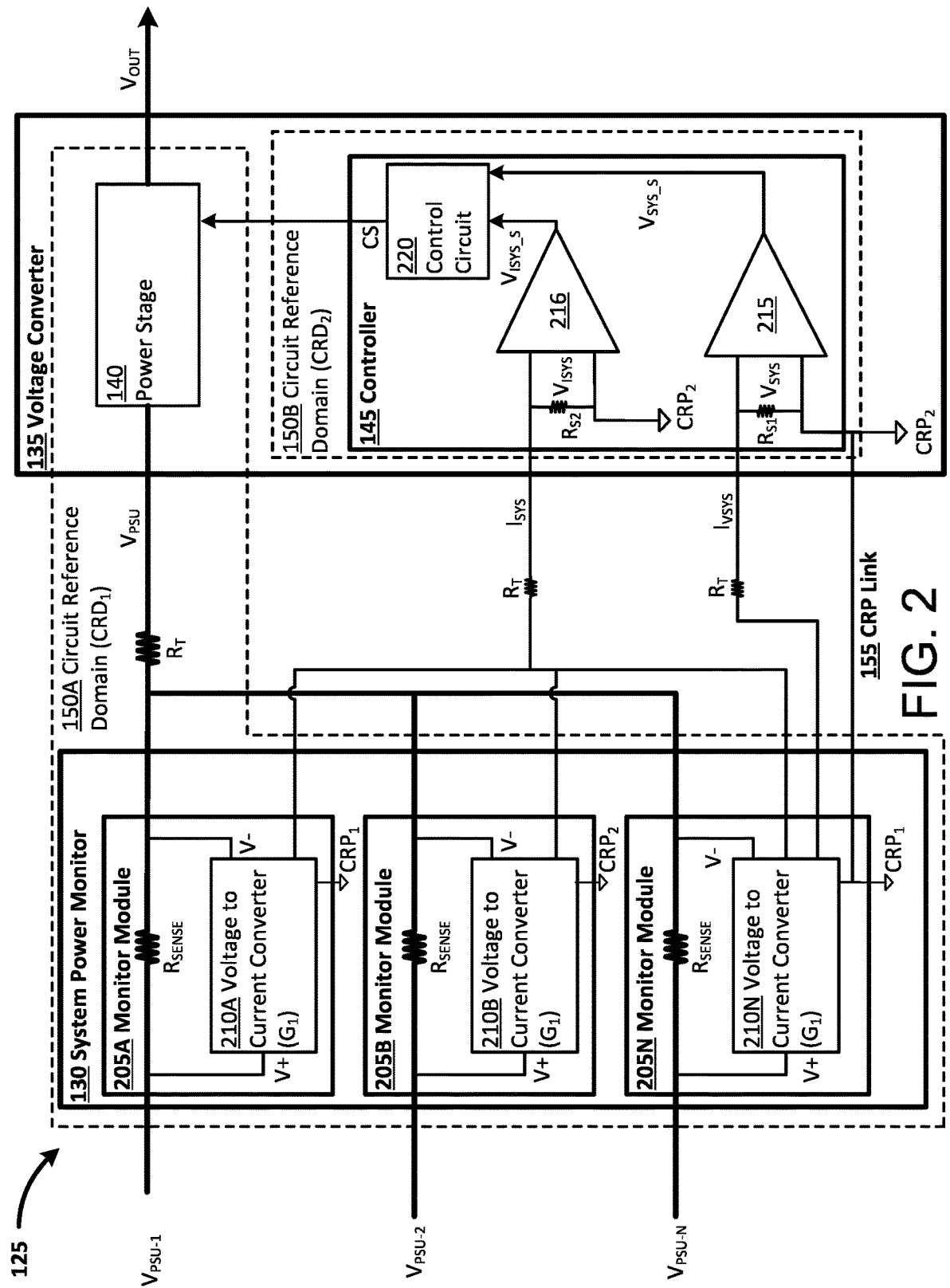
FIG. 2 depicts an exemplary NDRC in a multi-potential power circuit.

FIG. 2 depicts an exemplary NDRC in a multi-potential power circuit. The system power monitor 130 of the MPPC 125 includes monitor modules 205A, 205B, . . . , and 205N corresponding to the input voltage signals VPSU-1 through VPSU-N. Each monitor module 205 includes a voltage to current converter circuit 210 (210A, 210B, . . . , 210N corresponding to 205A, 205B, . . . , 205N). In the depicted example, the voltages are parallel such that VPSU1=VPSU2=VPSU-N=VPSU. Various embodiments may, by way of example and not limitation, be configured in series such that, for example, VPSU=VPSU1+VPSU2++ VPSUN. Each converter 210 may measure one or more output parameters of the power supply output with reference to V+ and CRP1 (e.g., VPSU) and with reference to V+ and V− (e.g., across a resistor with resistance RSENSE to generate a signal corresponding to a current and/or power of the power supply output). The converter 210 may measure an output parameter(s) of the power supply output in voltage mode and convert the resulting signal(s) into current mode before transmitting it out of CRD1.

In the depicted example, each monitor module 205 outputs a current mode output parameter ISYS. ISYS may correspond, for example, to a current of the power output, a power of the power output, or some combination thereof. The individual ISYS-N signals may, for example, be summed. A single ISYS-N may, for example, be selected for monitoring. In the depicted example, a single monitor module 205N further outputs current mode voltage signal IVSYS corresponding to a voltage of VPSU (e.g., where VPSU=VPSU-1=VPSU-2==VPSU-N). In various embodiments, IVSYS may be measured, as depicted, from a single PSU unit (e.g., VPSU-N). In various embodiments IVSYS may be measured from the VPSU signal. In the depicted example, the converter circuit 210N has a transconductance G1 between VPSU and current mode output voltage signal IVSYS. Accordingly, the voltage of the power supply output is given by Equation 1, where IVSYS is a current at the converter 210N and VPSU=VPSU-N:

$$VPSU \approx IVSYS*G1 \qquad \text{Equation 1.}$$

The current mode output voltage signal IVSYS is transmitted to the controller 145 across a link having transmission resistance RT. If the voltage signal were transmitted in voltage mode, the voltage at arrival would be less than an original voltage by a loss proportional to RT. By transmitting in current mode, a current (IVSYSR) seen (received) by the controller 145 is substantially equal to the current (IVSYS) originating from the converter 210N. For example, secondary effects (e.g., passive coupling to noise) may be neglected, as reflected in Equation 2.

$$IVSYS \approx IVSYSR \qquad \text{Equation 2.}$$

As depicted, the controller 145 is provided with an amplifier 215 configured to reconstruct the current voltage of the power supply output by converting the current mode signal IVSYS into a voltage mode signal VSYS with reference to CRP2 and a sensing resistor with resistance RS1, such that:

$$\text{VSYS=IVSYS} * RS1 \qquad \text{Equation 3.}$$

Equation 1 can be substituted into Equation 3 to express VSYS in terms of IVSYS:

$$\text{VSYS} \approx \text{IVSYS} * RS1 \qquad \text{Equation 4.}$$

Equation 1 can be solved for IVSYS to give Equation 5.

$$\text{IVSYS=VPSU}/G1 \qquad \text{Equation 5.}$$

Substituting Equation 5 into Equation 4 gives Equation 6 expressing VSYS in terms of the power supply output voltage and the transconductance.

$$\text{VSYS} \approx (\text{VPSU}/G1) * RS1 \qquad \text{Equation 6.}$$

Solving Equation 6 for VPSU results in Equation 7.

$$\text{VPSU} \approx \text{VSYS} * G1 \qquad \text{Equation 7.}$$

The amplifier 215 may, for example, be configured to scale VSYS by a factor substantially equal to G1. Accordingly, the controller 145 may advantageously reconstruct the voltage signal VPSU from a signal transmitted between CRD1 and CRD2 in current mode.

As depicted, the controller 145 is provided with an amplifier 216 configured to represent the measured current of the power supply output in voltage mode by converting the current mode signal ISYS into a voltage mode signal VISYS with reference to CRP2 and a sensing resistor with resistance RS2, such that:

$$\text{VISYS=ISYS} * RS2 \qquad \text{Equation 8.}$$

The amplifier 216 may, for example, be configured to scale VISYS by a factor to generate a scaled voltage mode signal VISYS representing the current ISYS.

In various embodiments the galvanic CRP link(s) 155 may, for example, provide a return path(s) with non-zero resistance for the current mode operating parameter signals (e.g., IVSYS, ISYS). Accordingly, significant noise (e.g., 90% or more) may be advantageously rejected by transmitting the output parameter(s) in current mode across CRDs referenced to different CRPs.

Figure 3:
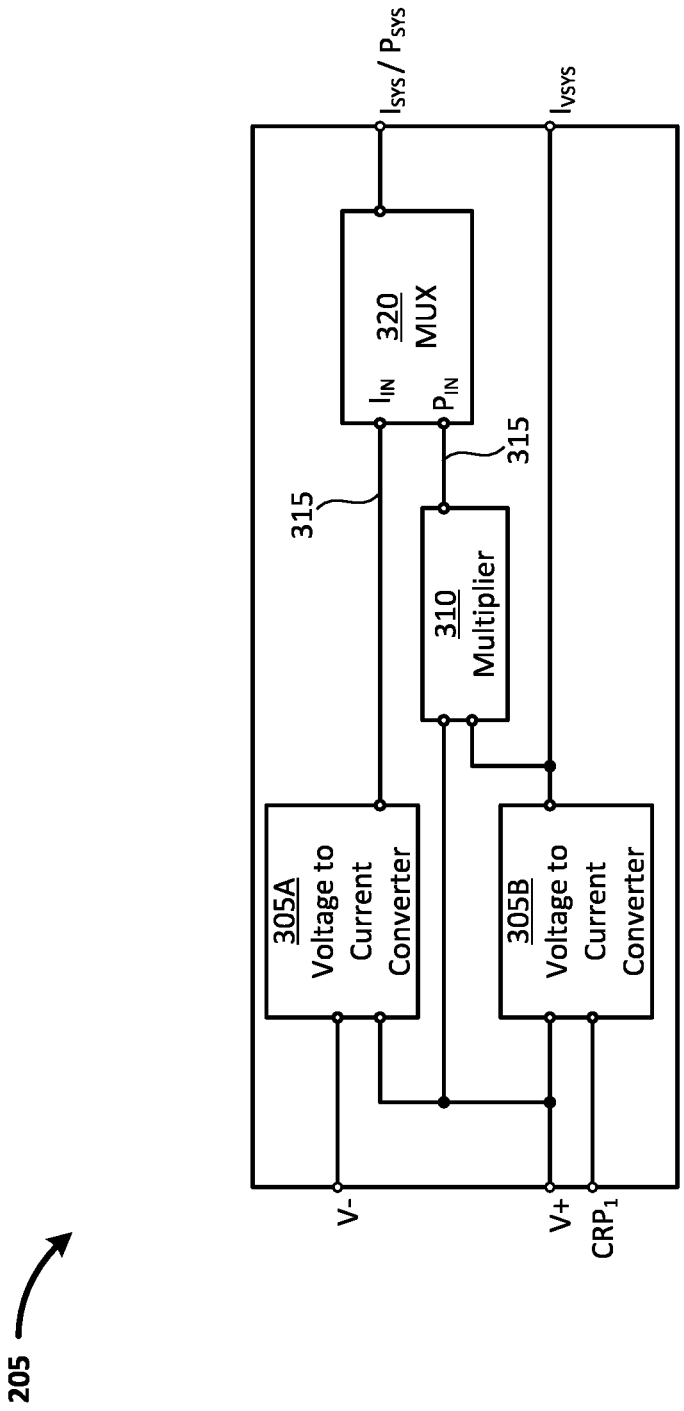
FIG. 3 depicts a block diagram of an exemplary monitor module circuit of an NDRC configured to detect at least one output parameter in voltage mode and convert to current mode.

FIG. 3 depicts a block diagram of an exemplary monitor module circuit of an NDRC configured to detect at least one output parameter in voltage mode and convert to current mode. The monitor module circuit 205 is operably connected to nodes V+ and V− across a voltage differential (e.g., across a resistor such as RSENSE). The monitor module 205 is further operably referenced to CRP1.

A first voltage to current converter 305A converts the voltage V+ with reference to V− to a first current output signal IIN (e.g., corresponding to a current of the power supply output). A second voltage to current converter 305B converts the voltage V+ with reference to CRP1 to a second current output signal IVSYS (e.g., corresponding to VPSU, the voltage of the power supply output). A multiplier circuit 310 may multiply V+(e.g., representing VSYS) and IIN (e.g., representing ISYS) to generate a third current output signal PIN (e.g., corresponding to a power of the power supply output). In various embodiments the multiplier circuit 310 may, for example, reference V+, V−, a difference between V+ and V−, or some combination thereof. A multiplexer circuit 320 may selectively transmit IIN and PIN as ISYS and PSYS via a single node. Accordingly, the monitor module circuit 205 may advantageously transmit current mode signals corresponding to current, power, and voltage of a power supply output. The monitor module 205 may, for example, be configured as an analog circuit, a digital circuit, or some combination thereof.

Figure 4:
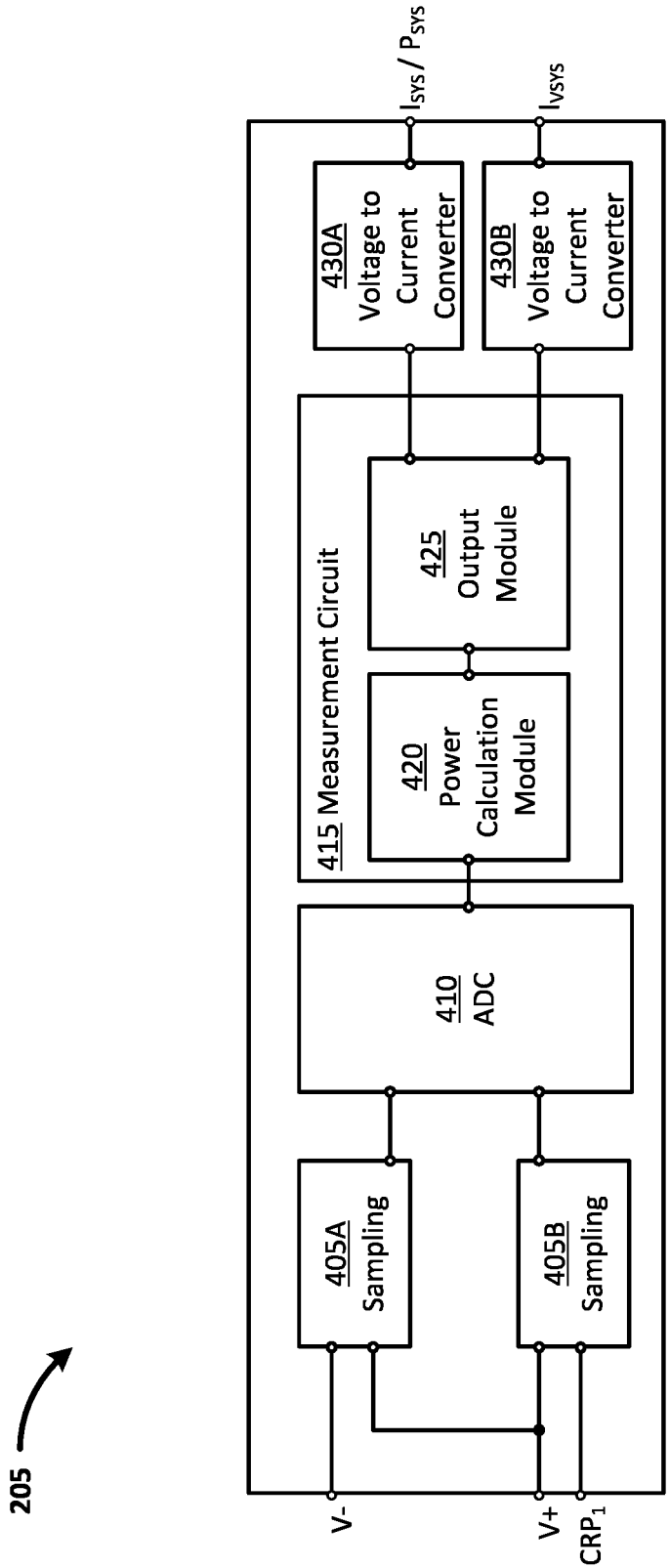
FIG. 4 depicts a block diagram of an exemplary digital monitor module circuit of an NDRC configured to detect at least one output parameter in voltage mode and convert to current mode.

FIG. 4 depicts a block diagram of an exemplary digital monitor module circuit of an NDRC configured to detect at least one output parameter in voltage mode and convert to current mode. In the depicted example, the exemplary monitor module circuit 205 is configured with digital circuits. The monitor module circuit 205 is operably connected to nodes V+ and V− across a voltage differential (e.g., across a resistor such as RSENSE). The monitor module 205 is further operably referenced to CRP1.

As depicted, a first sampling circuit 405A samples the voltage V+ with reference to V− (e.g., corresponding to current and/or power of a power supply output, detected in a voltage mode) and provides the results to an analog to digital converter (ADC) 410. A second sampling circuit 405B samples the voltage V+ with reference to CRP1 (e.g., corresponding to voltage (VPSU) of a power supply output, detected in a voltage mode) and provides the results to the ADC 410. The ADC 410 may convert the analog (voltage) signal into a digital (voltage) signal for a measurement circuit 415.

The measurement circuit 415 includes a power calculation module 420 and an output module 425. The power calculation module 420 may, by way of example and not limitation, calculate voltage, current, power, or some combination thereof from the signals generated by the ADC 410 from the signals from the sampling circuits 405A and 405B. For example, the power calculation module 420 may determine a voltage (e.g., VPSU) from a signal resulting from the sampling circuit 405B, a current from a signal resulting from the sampling circuit 405A, and/or a power from a combination of the signals resulting from the sampling circuits 405A and 405B. The measurement circuit 415 may, for example, include at least one processor, non-volatile memory, random access memory, lookup table, integrated circuit, ASIC, FPGA, or some combination thereof. The power calculation module may, by way of example and not limitation, include computer code configured to cause a processor to execute steps to generate the voltage, current, power, other appropriate parameter, or some combination thereof of a signal.

The output module 425 may condition the output such as, for example, scale, transform (e.g., electrically, mathematically), convert into a specific standard, code, and/or format, or some combination thereof. The output module 425 may identify and/or address specific data signals received from the power calculation module 420 to specific output nodes (e.g., current, power, and/or voltage). In the depicted example, the output module 425 provides an output signal related to a current and/or power output parameter to a first voltage to current converter (VCC) circuit 430A. The output module 425 further provides an output signal related to a voltage output parameter to a second VCC circuit 430B.

The VCCs 430A and 430B may, for example, convert the corresponding output parameter signals from the output module 425 from a voltage mode signal to a current mode signal. The VCC 430B may convert a received voltage output parameter signal from voltage mode into a current mode signal ISYS. The VCC 430A may convert a received current and/or power output parameter signal(s) from voltage mode into a current mode signal(s) ISYS (current output parameter) and/or PSYS (power output parameter). The power calculation module 420, the ADC 410, the measurement circuit 415, and/or the output module 425 may include, by way of example and not limitation, a multiplexer circuit configured to selectively calculate and/or output (e.g., choose one or more, alternate between multiple signals) different output parameter signals. For example, the VCC 430A may selectively output (e.g., by an analog and/or digital multiplexer in VCC 430A and/or upstream) the current mode current output parameter signal ISYS and the current mode power output parameter signal PSYS.

Figure 5:
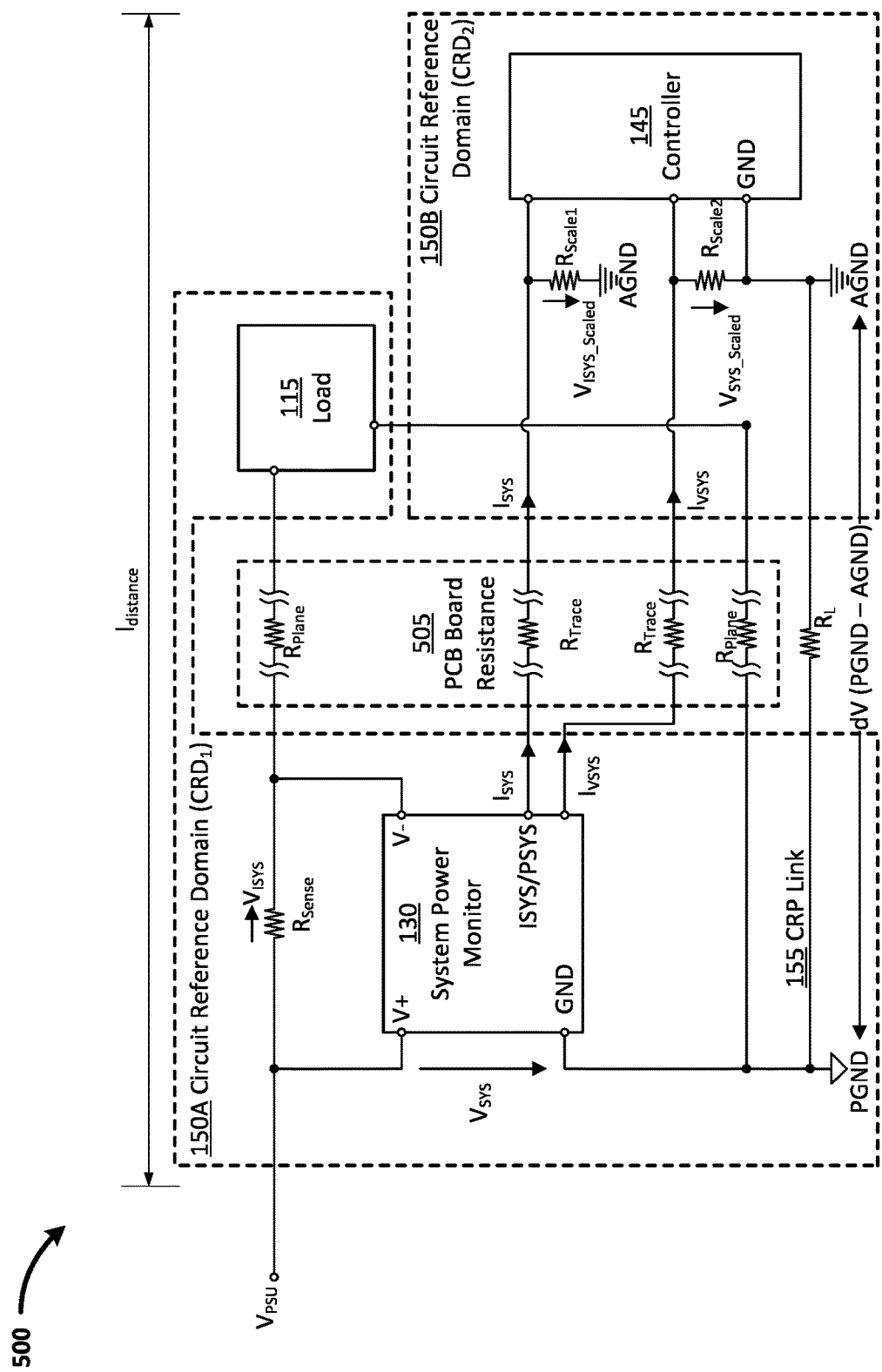
FIG. 5 depicts an exemplary implementation of a NDRC configured to transmit an output parameter(s) in current mode from a power CRD to an analog CRD.

FIG. 5 depicts an exemplary implementation of a NDRC configured to transmit an output parameter(s) in current mode from a power CRD to an analog CRD. The circuit 500 has a load 115 provided by a power supply output having a voltage VPSU-N. A SPMC 130 measures a voltage mode current (VISYS) of the power supply output across a resistor RSENSE at nodes V+ and V− of the SPMC 130. The SPMC 130 measures a voltage of the power supply output in voltage mode with reference to a first CRP. In the depicted example, the first CRP is a power ground reference (PGND). The SPMC 130 converts the voltage mode current output parameter signal (VISYS) to a current mode signal ISYS. The SPMC 130 converts the voltage mode voltage output parameter signal (VSYS) to a current mode signal IVSYS.

The current mode output parameter signals (ISYS and IVSYS) are transmitted from the SPMC 130, which is in a first CRD 150A (CRD1) referenced to PGND, to the controller 145. The controller 145 is in a second CRD 150B (CRD2) referenced to a second CRP. In the depicted example, the second CRP is an analog ground (AGND). Accordingly, the output parameter signals are transmitted from a power ground CRD to an analog ground CRD. In the depicted example, the current mode signals are converted back into voltage mode at the controller 145 by scaling resistors operably referenced to the AGND CRP. As depicted, ISYS is converted to scaled voltage mode signal VISYS_SCALED by a first resistor with resistance RSCALE1, and IVSYS is converted to scaled voltage mode signal VSYS_SCALED by a second resistor with resistance RSCALE2.

In the depicted example, physical transmission links between various components of the circuit 500 have resistance 505. The resistance may, for example, be resistance in paths through one or more printed circuit boards (PCBs), wires, cables, busses, other appropriate conductor, or some combination thereof. As depicted, the resistance encountered by the current mode output parameter signals between the SPMC 130 and the controller 145 may be at least partially from to traces in a PCB board (with resistance RTRACE). Similarly, a transmission link for the power supply output to the load in the first CRD 150A may, for example, be at least partially from conductors in a backplane (with resistance RPLANE).

As depicted, the transmission link resistance 505 (e.g., RTRACE) may introduce a voltage differential (dV) between the two CRPs AGND and PGND of the respective CRDs. In various embodiments dV may be between 1-3%. The voltage differential would introduce noise in an output parameter signal transmitted in voltage mode from the SPMC 130 in the power CRD (CRD1) and the controller 145 in the analog CRD (CRD2). This relationship is shown by Equation 9, where $VS_{CRD1}$ is the voltage mode signal at the SPMC 130 in the PGND crd and $VS_{CRD2}$ is the voltage mode signal seen/measured at the controller 145 in the AGND CRD:

$$VS_{CRD2} = VS_{CRD1} + dV \neq VS_{CRD1} \qquad \text{Equation 9.}$$

However, in various embodiments the load 115 may require a more stable and/or accurately controlled power output from the PSU. For example, the load 115 may include high performance processor(s) that require a tightly controlled power input (e.g., from the PSU(s)). In various embodiments the load 115 may require, by way of example and not limitation, less than 5%, 3%, or 1% variance in an output parameter (e.g., voltage) of the power supplied to the load.

In the depicted example, CRD1 and CRD2 are connected by a galvanic CRP link 155. The CRP link 155 provides a non-zero resistance ($R_L$) return path between AGND and PGND (CRP2 and CRP1, respectively) for one or more current mode signals (e.g., ISYS, IVSYS). Accordingly, a current mode output parameter signal (e.g., ISYS, IVSYS) at the SPMC 130 in the PGND CRD (CRD1) is substantially equivalent to the corresponding current mode output parameter signal seen at the controller 145 (e.g., ISYS, IVSYS, respectively) in the AGND CRD (CRD2). Noise introduced in current mode (e.g., ground noise) may be at least one order of magnitude lower than in voltage mode. Thus, an accurate output parameter (e.g., voltage, current, power) may be determined from the current mode signal. For example, voltage of the voltage signal VPSU may be accurately determined from IVSYS. Accordingly, noise disturbance in the output parameter signal may be attenuated, by way of example and not limitation, by a factor of at least 10, 100, or more when compared to transmission of a corresponding output parameter signal in a voltage mode. The reduced noise may advantageously provide a more stable and/or more tightly controlled voltage power output to the load 115. Accordingly, a power supply circuit including NDRC 500 may advantageously meet a more restrictive (e.g., smaller) error tolerance in providing a power supply signal to the load 115 than a power supply circuit transmitting output parameter signal(s) across one or more CRDs in voltage mode.

Although various embodiments have been described with reference to the figures, other embodiments are possible. For example, although an exemplary system has been described with reference to the figures, other implementations may be deployed in other industrial, scientific, medical, commercial, and/or residential applications.

In various embodiments multiple CRDs and corresponding CRPs may be provided including, by way of example and not limitation, 2, 3, 4, 5, 10, or more. Galvanic CRP links may connect any combination of CRDs, as appropriate. In various embodiments a voltage difference between two distinct CRPs (e.g., dV) may be substantially zero at low frequencies, but may increase at high frequencies. Accordingly, various embodiments may advantageously provide improved noise rejection at arbitrarily higher frequencies than achievable with voltage mode output parameter signals.

In various embodiments, some bypass circuits implementations may be controlled in response to signals from analog or digital components, which may be discrete, integrated, or a combination of each. Some embodiments may include programmed, programmable devices, or some combination thereof (e.g., PLAs, PLDs, ASICs, microcontroller, microprocessor), and may include one or more data stores (e.g., cell, register, block, page) that provide single or multi-level digital data storage capability, and which may be volatile, non-volatile, or some combination thereof. Some control functions may be implemented in hardware, software, firmware, or a combination of any of them.

Temporary auxiliary energy inputs may be received, for example, from chargeable or single use batteries, which may enable use in portable or remote applications. Some embodiments may operate with other DC voltage sources, such as batteries, for example. Alternating current (AC) inputs, which may be provided, for example from a 50/60 Hz power port, or from a portable electric generator, may be received via a rectifier and appropriate scaling. Provision for AC (e.g., sine wave, square wave, triangular wave) inputs may include a line frequency transformer to provide voltage step-up, voltage step-down, and/or isolation.

Various examples of modules may be implemented using circuitry, including various electronic hardware. By way of example and not limitation, the hardware may include transistors, resistors, capacitors, switches, integrated circuits, other modules, or some combination thereof. In various examples, the modules may include analog logic, digital logic, discrete components, traces and/or memory circuits fabricated on a silicon substrate including various integrated circuits (e.g., FPGAs, ASICs), or some combination thereof. In some embodiments, the module(s) may involve execution of preprogrammed instructions, software executed by a processor, or some combination thereof. For example, various modules may involve both hardware and software.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A noise disturbance rejection circuit comprising:
a power supply monitor circuit (PSMC) operably referenced to a first circuit reference potential (CRP) and configured (a) to generate a first voltage mode signal relative to the first CRP and corresponding to a first output parameter of a power output delivered to a load from a power supply circuit (PSC), and (b) to convert the first voltage mode signal into a first current mode signal;
a control circuit operably referenced to a second CRP and configured to generate a control signal from the first current mode signal, the control circuit being operably coupled to the PSC such that the PSC determines the first output parameter based on the control signal; and,
a galvanic link conductively connecting the first CRP and the second CRP and configured to communicate a return path for the first current mode signal via a non-zero resistance path,
wherein a noise margin of the first current mode signal presented at the control circuit is less than or equal to a predetermined fraction of a noise margin of an equivalent voltage mode signal.

2. The noise disturbance rejection circuit of claim 1, wherein the first output parameter comprises output voltage of the PSC.

3. The noise disturbance rejection circuit of claim 1, wherein the PSMC is further configured to generate a second current mode signal proportional to a second output parameter of the power output.

4. The noise disturbance rejection circuit of claim 3, wherein the PSMC is further configured to generate a second voltage mode signal proportional to the second output parameter, and to convert the second voltage mode signal into the second current mode signal.

5. The noise disturbance rejection circuit of claim 4, wherein the PSMC is further configured to:
generate the first voltage mode signal by measuring a first voltage reference of the power output relative the first CRP, and,
generate the second voltage mode signal by measuring the first voltage reference relative to a second voltage reference of the power output.

6. The noise disturbance rejection circuit of claim 3, wherein:
the second current mode signal represents current of the power output; and,
the PSMC is further configured to generate a third current mode signal representing power of the power output by multiplying the first current mode signal and the second current mode signal.

7. The noise disturbance rejection circuit of claim 1, wherein the control circuit converts the first current mode signal into a received voltage mode signal.

8. The noise disturbance rejection circuit of claim 1, wherein the predetermined fraction of the noise margin is ten percent.

9. A noise disturbance rejection circuit comprising:
a first circuit reference potential (CRP) to which a power supply monitor circuit (PSMC) is configured to be operably referenced, the PSMC being configured (a) to generate a first voltage mode signal relative to the first CRP and representing a first output parameter of a power supply circuit (PSC), and (b) to convert the first voltage mode signal into a first current mode signal;
a second CRP to which a control circuit is configured to be operably referenced, the control circuit being configured to receive the first current mode signal and to generate therefrom a control signal, wherein the control circuit is operably coupled to the PSC such that the control signal affects the output parameter; and,
a galvanic link conductively connecting the first CRP and the second CRP and configured to communicate a return path for the first current mode signal via a non-zero resistance path.

10. The noise disturbance rejection circuit of claim 9, wherein the first output parameter comprises output voltage of the PSC.

11. The noise disturbance rejection circuit of claim 9, wherein the PSMC comprises a voltage to current converter circuit configured to convert the first voltage mode signal into the first current mode signal.

12. The noise disturbance rejection circuit of claim 9, wherein the PSMC is further configured to generate a second current mode signal proportional to a second output parameter of the power output.

13. The noise disturbance rejection circuit of claim 12, wherein the second output parameter comprises output power of the PSC.

14. The noise disturbance rejection circuit of claim 12, wherein the second output parameter comprises output current of the PSC.

15. The noise disturbance rejection circuit of claim 12, wherein the PSMC is further configured to generate a second voltage mode signal proportional to the second output parameter, and to convert the second voltage mode signal into the second current mode signal.

16. The noise disturbance rejection circuit of claim 15, wherein the PSMC is further configured to:
generate the first voltage mode signal by measuring a first voltage reference of the power output relative the first CRP, and,
generate the second voltage mode signal by measuring the first voltage reference relative to a second voltage reference of the power output.

17. The noise disturbance rejection circuit of claim 12, wherein:
the second current mode signal represents current of the power output; and,
the PSMC is further configured to generate a third current mode signal representing power of the power output by multiplying the first current mode signal and the second current mode signal.

18. The noise disturbance rejection circuit of claim 9, wherein the control circuit converts the first current mode signal into a received voltage mode signal.

19. The noise disturbance rejection circuit of claim 9, wherein a noise margin of the first current mode signal presented at the control circuit is less than or equal to a predetermined fraction of a noise margin of an equivalent voltage mode signal.

20. The noise disturbance rejection circuit of claim 19, wherein the predetermined fraction of the noise margin is ten percent.

* * * * *